(12) United States Patent
Tamboli et al.

(10) Patent No.: US 8,765,653 B2
(45) Date of Patent: Jul. 1, 2014

(54) FORMULATIONS AND METHOD FOR POST-CMP CLEANING

(75) Inventors: Dnyanesh Chandrakant Tamboli, Breinigsville, PA (US); Madhukar Bhaskara Rao, Fogelsville, PA (US); Gautam Banerjee, Chandler, AZ (US); Keith Randolph Fabregas, Nazareth, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 12/797,903

(22) Filed: Jun. 10, 2010

(65) Prior Publication Data

US 2011/0136717 A1    Jun. 9, 2011

Related U.S. Application Data

(60) Provisional application No. 61/223,526, filed on Jul. 7, 2009.

(51) Int. Cl.
*C11D 7/32* (2006.01)
*C11D 11/00* (2006.01)

(52) U.S. Cl.
CPC ............... *C11D 11/0047* (2013.01); *C11D 7/3209* (2013.01)
USPC ............. 510/175; 510/178; 134/1.3

(58) Field of Classification Search
CPC .............. C11D 11/0047; C11D 7/3209
USPC ............................. 510/175; 134/1.3
See application file for complete search history.

(56) References Cited

U.S. PATENT DOCUMENTS

| | | | |
|---|---|---|---|
| 5,939,362 A * | 8/1999 | Johnson et al. | 507/118 |
| 6,319,330 B1 | 11/2001 | Jiang et al. | |
| 6,440,856 B1 * | 8/2002 | Bessho et al. | 438/691 |
| 6,565,619 B1 | 5/2003 | Asano et al. | |
| 6,730,644 B1 | 5/2004 | Ishikawa et al. | |
| 7,084,097 B2 | 8/2006 | Ishikawa et al. | |
| 7,163,644 B2 | 1/2007 | Akahori et al. | |
| 7,396,806 B2 | 7/2008 | Sakai et al. | |
| 7,427,362 B2 | 9/2008 | Liu | |
| 7,481,949 B2 | 1/2009 | Kawase et al. | |
| 7,497,966 B2 | 3/2009 | Nam et al. | |
| 2002/0077259 A1 | 6/2002 | Skee | |
| 2003/0004085 A1 | 1/2003 | Ando et al. | |
| 2003/0083214 A1 | 5/2003 | Kakizawa et al. | |
| 2003/0089891 A1 | 5/2003 | Andreas | |
| 2003/0129078 A1 | 7/2003 | Beardwood et al. | |
| 2003/0171233 A1 | 9/2003 | Abe et al. | |
| 2003/0228763 A1 | 12/2003 | Schroeder et al. | |
| 2004/0106531 A1 | 6/2004 | Kanno et al. | |
| 2005/0020463 A1 | 1/2005 | Ikemoto et al. | |
| 2005/0067164 A1 | 3/2005 | Ke et al. | |
| 2005/0205835 A1 | 9/2005 | Tamboli et al. | |
| 2005/0227492 A1 * | 10/2005 | Hah et al. | 438/696 |
| 2006/0128590 A1 | 6/2006 | Freer et al. | |
| 2008/0045016 A1 | 2/2008 | Andou et al. | |
| 2008/0173328 A1 | 7/2008 | Nishiwaki | |
| 2009/0088361 A1 | 4/2009 | Nishiwaki | |

FOREIGN PATENT DOCUMENTS

| | | |
|---|---|---|
| CN | 1712506 A | 12/2005 |
| EP | 1047121 A1 | 10/2000 |
| EP | 1628336 A2 | 2/2006 |
| JP | 11181494 | 7/1999 |
| JP | 2002-520812 | 1/2001 |
| JP | 2001-107089 | 4/2001 |
| JP | 2001207089 A | 4/2001 |
| JP | 2002289569 A | 10/2002 |
| JP | 2002359223 A2 | 12/2002 |
| JP | 2003013266 | 1/2003 |
| JP | 2003124160 | 4/2003 |
| JP | 2003289060 | 10/2003 |
| JP | 2006-515933 | 7/2004 |
| JP | 2005-307187 | 11/2005 |
| JP | 2006-041494 | 2/2006 |
| JP | 2008-047842 | 2/2008 |
| JP | 2008-182221 | 8/2008 |
| KR | 20020044593 | 6/2002 |
| KR | 20020084189 | 11/2002 |
| KR | 1020040007331 | 1/2004 |
| WO | WO0002238 A1 | 1/2000 |
| WO | 02086045 A1 | 10/2002 |
| WO | 03065433 A1 | 8/2003 |
| WO | 03091376 A1 | 11/2003 |
| WO | 2004037962 A2 | 5/2004 |
| WO | 2004-059700 A2 | 7/2004 |
| WO | 2007/092800 A2 | 8/2007 |
| WO | 2008/036823 A2 | 3/2008 |
| WO | 2008/144501 A8 | 11/2008 |

* cited by examiner

*Primary Examiner* — Gregory Webb
(74) *Attorney, Agent, or Firm* — Geoffrey L. Chase; Anne B. Kiernan

(57) ABSTRACT

The present invention is a method of cleaning to removal residue in semiconductor manufacturing processing, comprising contacting a surface to be cleaned with an aqueous formulation having a polymer selected from the group consisting of acrylamido-methyl-propane sulfonate) polymers, acrylic acid-2-acrylamido-2-methylpropane sulfonic acid copolymer and mixtures thereof and a quaternary ammonium hydroxide having greater than 4 carbon atoms or choline hydroxide with a non-acetylinic surfactant.

The present invention is also a post-CMP cleaning formulation having the components set forth in the method above.

27 Claims, No Drawings

FORMULATIONS AND METHOD FOR POST-CMP CLEANING

CROSS REFERENCE TO RELATED PATENT APPLICATIONS

The present patent application claims the benefit of U.S. Provisional Patent Application Ser. No. 61/223,526 filed Jul. 7, 2009.

BACKGROUND OF THE INVENTION

In the steps involving making of the semiconductor devices, cleaning is required at various steps to remove organic/inorganic residues. Cleaning to improve residue removal desired in semiconductor manufacturing processing, include; post-CMP (chemical mechanical planarization) cleaning, photo-resist ash residue removal, photoresist removal, various applications in back-end packaging such as pre-probe wafer cleaning, dicing, grinding etc.

A particular need for improved cleaning exists in post CMP cleaning of copper interconnects. Semiconductor wafers contain copper interconnection, which connects the active devices on the wafer with each other to from a functioning chip. The copper interconnects are formed by first forming trenches in a dielectric. A thin metallic barrier is typically deposited on the dielectric layer to prevent copper diffusion into the dielectric. This is followed by deposition of copper into the trenches. After the copper deposition, the wafer is polished using a process referred to as Chemical Mechanical Planarization (CMP). This process results in removal of excess copper deposits and planarizes the surface for the subsequent photolithographic step. After the CMP step, the wafer surface contains a large number of defects, which if not cleaned from the surface would result in a defective chip as an end-product. Typical defects after a CMP process are inorganic particles, organic residues, chemical residues, reaction products on the surface due to interaction of the wafer surface with the CMP slurry and elevated levels of undesirable metals on the surface. After the polishing step, the wafer is cleaned, most commonly using a brush scrubbing process. During this process, a cleaning chemistry is dispensed on the wafer to clean the wafer. The wafer is also later rinsed with deionized (DI) water, before a drying process is performed.

Patents in the generally in the field of the present application include:

JP 11-181494; U.S. Pat. No. 6,440,856; U.S. Pat. No. 7,497,966 B2; U.S. Pat. No. 7,427,362 B2; U.S. Pat. No. 7,163,644 B2; PCT/US2007/061588; U.S. Pat. No. 7,396,806; U.S. Pat. No. 6,730,644; U.S. Pat. No. 7,084,097; US 2003/0129078; and, US 2005/0067164.

None of the prior art could anticipate the improvement in residue removal ability that the present invention has shown with the use of the specific polymer and bases of the present invention. The formulations in the present invention were found to be very effective in removing the residues left behind by the above described CMP polishing process.

BRIEF SUMMARY OF THE INVENTION

The present invention is a method of cleaning to removal residue in semiconductor manufacturing processing, comprising contacting a surface to be cleaned with an aqueous formulation having a polymer selected from the group consisting of copolymers of acrylamido-methyl-propane sulfonate, acrylic acid-2-acrylamido-2-methylpropane sulfonic acid copolymer and mixtures thereof, a surfactant and a quaternary ammonium hydroxide selected from the group consisting of: quaternary alkyl ammonium hydroxide having greater than 4 carbon atoms and choline hydroxide when the surfactant is a non-acetylinic surfactant.

The present invention is also an aqueous formulation comprising;
(a) a polymer selected from the group consisting of acrylamido-methyl-propane sulfonate) copolymers, acrylic acid-2-acrylamido-2-methylpropane sulfonic acid copolymer and mixtures thereof;
(b) a quaternary ammonium hydroxide selected from the group consisting of:
quatemary alkyl ammonium hydroxide having greater than 4 carbon atoms and choline hydroxide in the absence of acetylinic surfactant,
capable of cleaning a semiconductor substrate after a process selected from the group consisting of post-CMP cleaning, photo-resist ash residue removal, photoresist removal, back-end packaging, pre-probe wafer cleaning, dicing, and grinding and photo-voltaic substrate cleaning.

In a preferred embodiment, the present invention is a post-CMP cleaning formulation comprising;
(a) Oxalic acid;
(b) Secondary alkane sulfonic acid surfactant;
(c) Acetylinic-based surfactant;
(d) quaternary alkyl ammonium hydroxide having greater than 4 carbon atoms to provide a pH is in the range of 1.5 to 4;
(e) An acrylic acid-2-acrylamido-2-methylpropane sulfonic acid copolymer or mixtures thereof; and,
(f) water.

In an alternate embodiment, the present invention is a post-CMP cleaning formulation comprising;
(a) Ethylene diamine tetraacetic acid (EDTA);
(b) Secondary alkane sulfonic acid surfactant;
(c) A secondary alcohol ethoxylate surfactant;
(d) quaternary ammonium hydroxide having greater than 4 carbon atoms to provide a pH between 7 and 12;
(e) An acrylic acid-2-acrylamido-2-methylpropane sulfonic acid copolymer or mixtures thereof; and,
(f) water.

In a further alternate embodiment, the present invention is a post-CMP cleaning formulation comprising;
(a) ethylene diamine tetraacetic acid;
(b) secondary alkane sulphonic acid surfactant;
(c) a non-acetylinic-based surfactant;
(d) choline hydroxide;
(e) a polymer selected from the group consisting of acrylamido-methyl-propane sulfonate) polymers, acrylic acid-2-acrylamido-2-methylpropane sulfonic acid copolymer and mixtures thereof; and,
(f) water.

DETAILED DESCRIPTION OF THE INVENTION

The invention relates to use of polymers containing a copolymer containing sulfonic acid and acrylic acid groups in cooperation with bases of a minimum molecular size in cleaning formulations. More specifically these copolymers are formed by polymerization of 2-acrylamido-2-methylpropane sulfonic acid monomers as one of the monomers and acrylic acid as the other monomer. These type of polymers are often termed as AA-AMPS polymers (acrylic acid-2-acrylamido-2-methylpropane sulfonic acid copolymer). Acrylic acid may also be substituted by other monomers including methacrylic acid, maliec acid, styrene, itaconic acid, acrylonitrile, vinyl acetate, N-Vinylpyrrolidone and the like. Addition of the polymers to post CMP formulations with appropriate bases leads to great improvement in cleaning performance. The mechanism of cleaning improvement is still under study. One likely mechanism may be physical adsorption on surfaces, which would prevent redeposition of removed particles and other residues. Another likely mechanism is the strong affinity towards the residues (organics) thereby increasing the driving force on lift-off during the cleaning process.

The preferred polymer is 2-acrylamido-2-methylpropanesulfonic acid-acrylic acid copolymer. This polymer is available under the commercial name of Dequest P9030 (CAS: 40623-75-4), supplied by Thermphos USA Corp., Anniston, Ala.* (AA-AMPS*) and has been found especially effective in improving cleaning performance. While these polymers are typically available as salts (Na or K), for use in critical applications as in electronics industry they may be purified using suitable technique, such as ion exchange, to remove the metal ions and replace them with non-metallic ions, such as $H^+$.

These types of polymers or mixtures thereof can be added in concentrations from 0.01 to 10 wt % to the cleaning formulations. A preferred concentration range is between 0.1% to 5 wt %. The formulations may be diluted by a factor of 1 to 10000 at point of use through addition of solvent, such as water. Alternatively, the formulations may be supplied in diluted form for the direct use without the dilution at the point of use.

Chemistries containing such polymers may be used in a variety of cleaning applications, which demand removal of residues from a surface. The residues may be inorganic or organic in nature. Examples of processes, where formulations containing these polymers may be effective, include; post-CMP cleaning, photo-resist ash residue removal, photoresist removal, and various applications in back-end packaging, such as; pre-probe wafer cleaning, dicing, grinding etc as well as cleaning of wafers for photovoltaic applications. Base to increase the pH: pH of the cleaning solution may range from 0.25 to 13.

An important aspect of the present invention is the combination of the above polymers with a base of a particular molecular size and compatibility with the other components of the formulation. The base adjusts the pH to the desired level. This invention shows unexpected improvement when a quaternary alkyl ammonium hydroxide having greater than 4 carbon atoms is used in combination with the polymers described above. Examples of quaternary ammonium bases having greater than 4 carbon atoms include tetraethyl ammonium hydroxide, tetrapropyl ammonium hydroxide, tetrabutyl ammonium hydroxide, trimethylethylammonium hydroxide, and dimethyl diethyl ammonium hydroxide. For the purpose of the present invention, the term quaternary alkyl ammonium hydroxide is deemed to mean that all groups bonded to the ammonium hydroxide are either alkyl or hydrogen. This excludes alcohols and other non-alkyl or hydrogen groups. Preferably, the base is added in an amount sufficient to adjust the pH in the range of 1.5 to 4.0.

It is also possible to use a base in the form of choline hydroxide as long as a non-acetylinic alcohol surfactant is used. Choline hydroxide was found to be incompatible with acetylinic diol surfactants in the formulations of the present invention. This incompatibility is evaluated in Example 6 below. When choline hydroxide was used in the absence of acetylinic diol surfactants, the choline hydroxide was acceptable.

For post-CMP cleaning formulations, there may be additional components present which help with cleaning performance. Common types of additives include the following.

Organic acids or mixtures thereof: Organic acid can be chosen from a broad range of acids, including but not limited to; oxalic acid, citric acid, maliec acid, malic acid, malonic acid, gluconic acid, glutaric acid, ascorbic acid, formic acid, acetic acid, ethylene diamine tetraacetic acid, diethylene triamine pentaacetic acid, glycine, alanine, cystine etc. Salts of these acids may also be used. A mixture of acids/salts may be used as well. Organic acids function to improve trace metal removals, remove organic residues, pH adjustment or reduce corrosion of metals. The preferred organic acid in the acidic pH is oxalic acid. Preferred organic acid in the alkaline pH is ethylene diamine tetra acetic acid. The cleaning chemistry may contain from 1 ppm to 30 wt % of the acids/salts. Preferred acid concentration range from 10 ppm to 5 wt %.

Surfactant: Surfactants are used in cleaning chemistries to improve wetting of the surface being cleaned and help remove residues from the surface, without redepositing on the surfaces. Surfacants may also reduce water-marks on the surface, which are the defects formed during the drying phase, which follows cleaning. Any type of surfactant anionic/cationic/non-ionic/zwitterionic or combinations thereof may be used. The choice of this surfactant may depend upon various criteria, including; wetting properties, foaming properties, detergency, rinsability, etc. A combination of surfactants may also be used, wherein one surfactant is used to solubilize a less soluble hydrophobic surfactant molecule.

In these embodiments, surfactant concentration may range from 1 ppb to 10000 ppm or preferably from 1 ppm to 5000 ppm. Examples of surfactants include: silicone surfactants, poly(alkylene oxide) surfactants, and fluorochemical surfactants. Suitable non-ionic surfactants for use in the process composition include, but are not limited to: octyl and nonyl phenol ethoxylates, such as; TRITON® X-114, X-102, X-45, X-15 and alcohol ethoxylates, such as; BRIJ® 56 ($C_{16}H_{33}$ ($OCH_2CH_2)_{10}OH$) (ICI), BRIJ® 58 ($C_{16}H_{33}(OCH_2CH_2)_{20}OH$) (ICI). Anionic surfactants may include linear alkylbenzenesulfonates (LAS), secondary alkylbenzenesulfonate, fatty alcohol sulfates (FAS), secondary alkanesulfonates (SAS) and in some cases also fatty alcohol ether sulfates (FAES). Still further exemplary surfactants include: acetylenic diol type of surfactants, alcohol (primary and secondary) ethoxylates, amine ethoxylates, glucosides, glucamides, polyethylene glycols, poly(ethylene glycol-co-propylene glycol), or other surfactants provided in the reference: McCutcheon's Emulsifiers and Detergents, North American Edition for the Year 2000 published by Manufacturers Confectioners Publishing Co. of Glen Rock, N.J. The surfactants may be used at concentrations from 1 ppm to 10 wt %.

Optional chelating agent: Since a chelating agent may be more selective with regard to one metal ion over another, a plurality of chelating agents or salts thereof are used in the compositions described herein. It is believed that these chelating agents may bind to metal ion contaminants on the substrate surface and dissolve them into the composition. Further, in certain embodiments, the chelating agent should be able to retain these metal ions in the composition and prevent the ions from re-depositing on the substrate surface. Examples of suitable chelating agents that may be used include, but are not limited to: ethylenediaminetetracetic acid (EDTA), N-hydroxyethylethylenediaminetriacetic acid (NHEDTA), nitrilotriacetic acid (NTA), diethylklenetriaminepentacetic acid (DPTA), ethanoldiglycinate, citric acid, gluconic acid, oxalic acid, phosphoric acid, tartaric acid, methyldiphosphonic acid, aminotrismethylenephosphonic acid, ethylidene-diphosphonic acid, 1-hydroxyethylidene-1, 1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexadiaminetetrakismethylenephosphonic acid, diethylenetriaminepentamethylenephosphonic acid and 1,2-propanediaminetetetamethylenephosphonic acid or ammonium salts, organic amine salts, maronic acid, succinic acid, dimercapto succinic acid, glutaric acid, maleic acid, phthalic acid, fumaric acid, polycarboxylic acids such as tricarbaryl acid, propane-1,1,2,3-tetracarboxylic acid, butane-1,2,3,4-tetracarboxylic acid, pyromellitic acid, oxycarboxylic acids such as glycolic acid, β-hydroxypropionic acid, citric acid, malic acid, tartaric acid, pyruvic acid, diglycol acid, salicylic acid, gallic acid, polyphenols such as catechol, pyrogallol, phosphoric acids such as pyrophosphoric acid, polyphosphoric acid, heterocyclic compounds such as 8-oxyquinoline, and diketones such as α-dipyridyl acetylacetone.

Optional dispersing agents and polymers.
Optional organic solvents.
Optional defoaming compounds.

Example 1

Following formulations were prepared

TABLE 1

| Run | Oxalic Acid (%) | Hostapur SAS (%) | AA-AMPS * (%) | Base Used for pH Adjustment | pH | Residue Defect count |
|---|---|---|---|---|---|---|
| A | 3 | 0.75 | 0 | Choline Hydroxide | 2.5 | 12562 |
| B | 3 | 0.75 | 1.05 | Choline Hydroxide | 2.5 | 82 |
| C | 3 | 0.75 | 0 | Tetraethyl ammonium Hydroxide | 2.5 | 25389 |
| D | 3 | 0.75 | 1.05 | Tetraethyl ammonium hydroxide | 2.5 | 137 |
| E | 3 | 0.75 | 0 | Tetrapropyl ammonium hydroxide | 2.5 | 16173 |
| F | 3 | 0.75 | 1.05 | Tetrapropyl ammonium hydroxide | 2.5 | 155 |
| G | 3 | 0.75 | 0 | Tetramethyl ammonium Hydroxide | 2.5 | 1650 |
| H | 3 | 0.75 | 1.05 | Tetramethyl ammonium Hydroxide | 2.5 | 397 |
| I | 3 | 0.75 | 0 | Potassium Hydroxide | 2.5 | 102 |
| J | 3 | 0.75 | 1.05 | Potassium Hydroxide | 2.5 | 78 |
| K | 3 | 0.75 | 0 | $NH_4OH$ | 2.5 | 6452 |
| L | 3 | 0.75 | 1.05 | $NH_4OH$ | 2.5 | 378 |

These were formulated to show the effect of AA-AMPS* (*Dequest P9030) polymer in formulations made with different bases. These formulations were diluted 1:50 ratio with DI water for the cleaning testes.

Blanket copper wafers were polished on an IPEC 472 CMP tool with a two step process (1) 1 minute polish using Cu3900 CMP slurry from DuPont Air Products Nanomaterials, LLC, Tempe, Ariz., on platen 1 of the polisher (2) 1 minute polish with DP6545-MO5 barrier slurry from DuPont Air Products Nanomaterials, LLC, Tempe, Ariz., on platen 2 of the polisher. The wafers were cleaned on an Ontrak DSS200 wafer scrubber tool. In this study, wafers were subjected to 20 seconds (s) chemical dispense and 30 s DI water rinse in a first brush box. In a second brush box, the wafer was subjected to an additional 5 s chemical dispense and 45 s of DI water rinse.

The AA-AMPS* Formulations A-F are formulated with quaternary ammonium hydroxides with greater than 4 carbon atoms in their structure. They show the largest improvement in the defectivity with the addition of AA-AMPS* polymer addition.

With other bases, such as; tetramethyl ammonium hydroxide and ammonium hydroxide, the defectivity improvement with AA-AMPS* polymer addition is smaller; and at the same time, the defectivity even with AA-AMPS* addition is relatively high.

Formulations containing potassium hydroxides provide low residue effects, however potassium hydroxides are not desirable in semiconductor fabrication process, because of possible the harmful impact of residual potassium ions on the dielectric properties.

Example 2

The following formulations were made to evaluate the AA-AMPS* containing formulations in different types of surfactants. These formulations were made with tetraethylammonium hydroxide base to achieve a pH of 2.5.

TABLE 2

| Run | Oxalic Acid (%) | Surfactant concentration (%) | Surfactant used | AA-AMPS* (%) | pH | Residue Defect count |
|---|---|---|---|---|---|---|
| M | 3 | 0.75 | None | 1.05 | 2.5 | 78 |
| N | 3 | 0.75 | Calfax DBA-70 (Anionic Surfactant) | 1.05 | 2.5 | 53 |
| O | 3 | 0.75 | Tergitol 15-S-7 (Non-ionic Surfactant) | 1.05 | 2.5 | 34 |
| P | 3 | 0.75 | Tomah Q-18-15 (Cationic Surfactant) | 1.05 | 2.5 | 43 |

These formulations were diluted to a 1:50 ratio with DI water for the cleaning tests. Blanket copper wafers were polished on an IPEC 472 CMP polishing tool with a two step process: (1) 1 minute polish using Cu3900 CMP polishing slurry on a first platen of the polisher; and, (2) 1 minute polish with CMP6545 CMP polishing barrier slurry on a second platen of the polisher. The wafers were cleaned on an Ontrak DSS200 wafer scrubber. In this study, wafers were subjected to 20 seconds (s) chemical dispense and 30 s DI water rinse in a first brush box. In a second brush box, the wafers were subjected to an additional 5 s chemical dispense and 45 s of DI water rinse. The wafers were inspected using an Orbot Duo 736 wafer inspection tool. 100 defects were randomly reviewed per wafer. The number of residue defects found in 50 defect images were normalized to the total defect numbers found on the wafers, shown in Table 2

The results show excellent low defectivity is achievable with a wide range of surfactants, as well as when no surfatctant was used.

Example 3

Following formulations were made to effect of pH on the cleaning performance. pH adjustment was performed with tetraethyl ammonium hydroxide.

TABLE 3

| Run | Oxalic Acid (%) | Hostapur SAS (%) | AA-AMPS* (%) | pH | Residue Defect count |
|---|---|---|---|---|---|
| Q | 3 | 0.75 | 1.05 | 2 | 53 |
| R | 3 | 0.75 | 1.05 | 3 | 41 |
| S | 3 | 0.75 | 1.05 | 4 | 96 |
| T | 3 | 0.75 | 1.05 | 9 | 44 |

The methodology was the same as Example 2 for polishing, cleaning and analyzing copper wafers. The results show very low defectivity over a wide pH range.

Example 4

The following formulations were made with different acids. Tetraethyl ammonium hydroxide was used for pH adjustment. Citric acid was chosen as a example of hydroxycarbxylic acid and ethylene diamine tetraacetic acid (EDTA) was chosen as a example of amino carboxylic acid.

TABLE 4

| Run | Citric Acid (%) | EDTA (%) | Hostapur SAS (%) | Tergitol 15-S-7 (%) | AA-AMPS* (%) | pH | Residue Defect count |
|---|---|---|---|---|---|---|---|
| U | 3 | | 0.75 | | 1.05 | 2.5 | 56 |
| V | | 2.5 | 1 | 0.5 | 1.4 | 10.5 | 23 |

The methodology was the same as Example 2 for polishing, cleaning and analyzing copper wafers. The results of Table 4 show very low defectivity is possible for a variety of organic acids.

Example 5

The following formulations (C-E) were prepared with tetraethylammonium hydroxide as a pH adjustor. These formulations were diluted to a 1:25 ratio with DI water for the cleaning tests. Blanket copper wafers were polished on an IPEC 472 polishing tool with a two step process: (1) 1 minute polish using Cu3900 CMP polishing slurry on a first platen of the polisher; and, (2) 1 minute polish with DP6545-MO5 CMP polishing barrier slurry on a second platen of the polisher. The wafers were cleaned on an Ontrak DSS200 wafer scrubber. In this study, wafers were subjected to 20 seconds (s) chemical dispense and 30 s DI water rinse in a first brush box. In a second brush box, the wafers were subjected to an additional 5 s chemical dispense and 45 s of DI water rinse. The wafers were inspected using an Orbot Duo 736 wafer inspection tool. 100 defects were randomly reviewed per wafer. The number of residue defects found in 100 defect images, were normalized to the total defect numbers found on the wafers, shown in Table 5.

TABLE 5

| Run | Oxalic Acid (%) | Hostapur SAS (%) | Dynol 604 (%) | AA-AMPS* (%) | Tetraethylammonium Hydroxide (%) | Residue Defect count |
|---|---|---|---|---|---|---|
| W | 2 | 0.5 | 0.25 | 0.175 | 3.32 | 121 |
| X | 2 | 0.5 | 0.25 | 0.2625 | 3.34 | 64 |
| Y | 2 | 0.5 | 0.25 | 0.35 | 3.39 | 57 |
| Z | 2 | 0.5 | 0.25 | 0.4375 | 3.46 | 34 |
| AA | 2 | 0.5 | 0.25 | 0.525 | 3.51 | 46 |
| BB | 2 | 0.5 | 0.25 | 0.7 | 3.57 | 18 |
| CC | 2 | 0.5 | 0.25 | 0.875 | 3.59 | 21 |

It is clearly evident that increasing the concentration of AA-AMPS* (*Dequest P9030) results in improved residue removal.

Example 6

Choline hydroxide presents a special case as a base for formulating a post CMP formulation with AA-AMPS* (*Dequest P9030). Although an effective base when used in combination with AA-AMPS* or analogous acrylic/sulfonic polymers, choline hydroxide has been found to not be compatible with acetylinic diol surfactants, such as Dynol 604. When the acetylinic diol surfactant was added to the formulations set forth below, the solutions became cloudy, indicating a precipitate, and the cloudiness persisted and did not clear. This instability and cloudiness, consistent with reaction and precipitate formation is unacceptable for a commercial formulation and shelf life considerations. See the results in Table 6 below.

TABLE 6

| Run | Oxalic Acid (%) | Secondary Alkane Sulfonic acid surfactant (%) | Dynol 604 (%) | AA-AMPS* (%) | Base (%) | Precipitate |
|---|---|---|---|---|---|---|
| DD | 2 | 0.59 | 0.25 | 0.17 | Choline Hydroxide (2.65%) | Yes |

The invention claimed is:

1. A method of cleaning to remove residue in semiconductor manufacturing processing, comprising:
   contacting a surface to be cleaned with an aqueous formulation having a polymer selected from the group consisting of acrylamido-methyl-propane sulfonate) polymers, acrylic acid-2-acrylamido-2-methylpropane sulfonic acid copolymer and mixtures thereof, and a quaternary ammonium hydroxide selected from the group consisting of: quaternary alkyl ammonium hydroxide having greater than 4 carbon atoms and choline hydroxide.

2. The method of claim 1 wherein the semiconductor manufacturing processing is selected from the group consisting of post-CMP cleaning, photo-resist ash residue removal, photoresist removal, back-end packaging, pre-probe wafer cleaning, dicing, and grinding and photo-voltaic substrate cleaning.

3. The method of claim 1 wherein the surface comprises copper patterns on a dielectric substrate.

4. The method of claim 1 wherein the polymer is present in a concentration of 1 ppb to 10 wt &.

5. The method of claim 1 wherein the polymer is present in a concentration of 0.1 ppm to 5 wt %.

6. The method of claim 1, wherein the formulation further comprises an organic acid.

7. The method of claim 6 wherein the organic acid is selected from the group consisting of oxalic acid, citric acid, maliec acid, malic acid, malonic acid, gluconic acid, glutaric acid, ascorbic acid, formic acid, acetic acid, ethylene diamine tetraacetic acid, diethylene triamine pentaacetic acid, glycine, alanine, cystine, salts of such acids and mixtures thereof.

8. The method of claim 1 wherein the quaternary alkyl ammonium hydroxide having greater than 4 carbon atoms has less than sixteen carbon atoms.

9. The method of claim 1, wherein the formulation further comprises a surfactant, wherein the surfactant is selected from the group consisting of acetylinic diol surfactants, silicone surfactants, poly(alkylene oxide) surfactants, fluorochemical surfactants, octyl and nonyl phenol ethoxylates, alcohol ethoxylates, $(C_{16}H_{33}(OCH_2CH_2)_{10}OH)$ (ICI), $(C_{16}H_{33}(OCH_2CH_2)_{20}OH)$, amine ethoxylates, glucosides, glucamides, polyethylene glycols, poly(ethylene glycol-co-propylene glycol), linear alkylbenzenesulfonates (LAS), secondary alylbenzenesulfonate, fatty alcohol sulfates (FAS), secondary alkanesulfonates (SAS) and in some cases also fatty alcohol ether sulfates (FAES) and mixtures thereof.

10. The method of claim 1, wherein the formulation further comprises a chelating agent.

11. The method of claim 10 wherein the chelating agent is selected from the group consisting of ethylenediaminetetracetic acid (EDTA), N-hydroxyethylethylenediaminetriacetic acid (NHEDTA), nitrilotriacetic acid (NTA), diethylklenetriaminepentacetic acid (DPTA), ethanoldiglycinate, citric acid, gluconic acid, oxalic acid, phosphoric acid, tartaric acid, methyldiphosphonic acid, aminotrismethylenephosphonic acid, ethylidene-diphosphonic acid, 1-hydroxyethylidene-1,1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexadiaminetetrakismethylenephosphonic acid, diethylenetriaminepentamethylenephosphonic acid and 1,2-propanediaminetetetamethylenephosphonic acid, maronic acid, succinic acid, dimercapto succinic acid, glutaric acid, maleic acid, phthalic acid, fumaric acid, polycarboxylic acids, tricarbaryl acid, propane-1,1,2,3-tetracarboxylic acid, butane-1,2,3,4-tetracarboxylic acid, pyromellitic acid, oxycarboxylic acids, glycolic acid, β-hydroxypropionic acid, citric acid, malic acid, tartaric acid, pyruvic acid, diglycol acid, salicylic acid, gallic acid, polyphenols, catechol, pyrogallol, phosphoric acids, pyrophosphoric acid, polyphosphoric acid, heterocyclic compounds, 8-oxyquinoline, diketones, α-dipyridyl acetylacetone, salts of the same and mixtures thereof.

12. The method of claim 1 wherein the quaternary alkyl ammonium hydroxide is selected from the group consisting of tetraethylammonium hydroxide, tetrapropylammonium hydroxide, tetrabutyl ammonium hydroxide, dimethyl diethyl ammonium hydroxide, trimethylethylammonium hydroxide and mixtures thereof.

13. The method of claim 1, wherein the formulation further comprises an agent selected from the group consisting of dispersing agents, organic solvents, defoaming agents and mixtures thereof.

14. An aqueous cleaning formulation comprising:
(a) a polymer selected from the group consisting of acrylamido-methyl-propane sulfonate) polymers, acrylic acid-2-acrylamido-2-methylpropane sulfonic acid copolymer, and mixtures thereof; and
(b) a quaternary ammonium hydroxide selected from the group consisting of: quaternary alkyl ammonium hydroxide having greater than 4 carbon atoms, and choline hydroxide in the absence of a non-acetylinic surfactant.

15. The formulation of claim 14 wherein the polymer is present in a concentration of 1 ppb to 10 wt %.

16. The formulation of claim 14 wherein the polymer is present in a concentration of 0.1 ppm to 1000 ppm.

17. The formulation of claim 14 including an organic acid.

18. The formulation of claim 17 wherein the organic acid is selected from the group consisting of oxalic acid, citric acid, maleic acid, malic acid, malonic acid, gluconic acid, glutaric acid, ascorbic acid, formic acid, acetic acid, ethylene diamine tetraacetic acid, diethylene triamine pentaacetic acid, glycine, alanine, cystine, salts of such acids, and mixtures thereof.

19. The formulation of claim 14 wherein the quaternary ammonium hydroxide with greater than 5 carbon atoms in their molecular structure has less than sixteen carbon atoms in their molecular structure.

20. The formulation of claim 14 including a surfactant wherein the surfactant is selected from the group consisting of acetylinic diol surfactants, silicone surfactants, poly(alkylene oxide) surfactants, fluorochemical surfactants, octyl and nonyl phenol ethoxylates, alcohol ethoxylates, $(C_{16}H_{33}(OCH_2CH_2)_{10}OH)$ (ICI), $(C_{16}H_{33}(OCH_2CH_2)_{20}OH)$, amine ethoxylates, glucosides, glucamides, polyethylene glycols, poly(ethylene glycol-co-propylene glycol), linear alkylbenzenesulfonates (LAS), secondary alylbenzenesulfonate, fatty alcohol sulfates (FAS), secondary alkanesulfonates (SAS), fatty alcohol ether sulfates (FAES) and mixtures thereof.

21. The formulation of claim 14 including a chelating agent.

22. The formulation of claim 21 wherein the chelating agent is selected from the group consisting of ethylenediaminetetracetic acid (EDTA), N-hydroxyethylethylenediaminetriacetic acid (NHEDTA), nitrilotriacetic acid (NTA), diethylklenetriaminepentacetic acid (DPTA), ethanoldiglycinate, citric acid, gluconic acid, oxalic acid, phosphoric acid, tartaric acid, methyldiphosphonic acid, aminotrismethylenephosphonic acid, ethylidene-diphosphonic acid, 1-hydroxyethylidene-1,1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexadiaminetetrakismethylenephosphonic acid, diethylenetriaminepentamethylenephosphonic acid and 1,2-propanediaminetetetamethylenephosphonic acid, maronic acid, succinic acid, dimercapto succinic acid, glutaric acid, maleic acid, phthalic acid, fumaric acid, polycarboxylic acids, tricarbaryl acid, propane-1,1,2,3-tetracarboxylic acid, butane-1,2,3,4-tetracarboxylic acid, pyromellitic acid, oxycarboxylic acids, glycolic acid, β-hydroxypropionic acid, citric acid, malic acid, tartaric acid, pyruvic acid, diglycol acid, salicylic acid, gallic acid, polyphenols, catechol, pyrogallol, phosphoric acids, pyrophosphoric acid, polyphosphoric acid, heterocyclic compounds, 8-oxyquinoline, diketones, α-dipyridyl acetylacetone, salts of the same and mixtures thereof.

23. The formulation of claim 14 wherein the quaternary alkyl ammonium hydroxide is selected from the group consisting of tetraethylammonium hydroxide, tetrapropylammonium hydroxide, tetrabutyl ammonium hydroxide, dimethyl diethyl ammonium hydroxide, trimethylethylammonium hydroxide and mixtures thereof.

24. A post-CMP cleaning formulation comprising;
(a) Oxalic acid;
(b) Secondary alkane sulphonic acid;
(c) Acetylinic-based surfactant;
(d) quaternary alkyl ammonium hydroxide having greater than 4 carbon atoms;
(e) a polymer selected from the group consisting of acrylamido-methyl-propane sulfonate) polymers, acrylic acid-2-acrylamido-2-methylpropane sulfonic acid copolymer and mixtures thereof; and,
(f) water.

25. The formulation of claim 23, comprising: 1-6 wt % oxalic acid, 0.1-2 wt % secondary alkane sulphonate, 0.05-1.5 wt % acetylinic-based surfactant, 0.1-3 wt % acrylic acid-2-acrylamido-2-methylpropane sulfonic acid copolymer; quaternary alkyl ammonium hydroxide having greater than 4 carbon atoms to adjust the pH in the range of 1-7, remainder water.

26. The formulation of claim 24 diluted with water in the range of 1:0 to 1:10000 at the point of use.

27. A post-CMP cleaning formulation comprising;
(a) ethylene diamine tetraacetic acid;
(b) secondary alkane sulphonic acid surfactant;
(c) a non-acetylinic-based surfactant;
(d) choline hydroxide;
(e) a polymer selected from the group consisting of acrylamido-methyl-propane sulfonate) polymers, acrylic acid-2-acrylamido-2-methylpropane sulfonic acid copolymer and mixtures thereof; and
(f) water.

* * * * *